US009402305B2

(12) United States Patent
Nirmal et al.

(10) Patent No.: US 9,402,305 B2
(45) Date of Patent: *Jul. 26, 2016

(54) TRANSPARENT CONDUCTING ARTICLE COMPRISING FIRST AND SECOND CONDUCTIVE LAYERS AND AN INTERVENING INORGANIC DIELECTRIC LAYER HAVING A PLURALITY OF APERTURES THEREIN

(71) Applicant: 3M INNOVATIVE PROPERTIES COMPANY, St. Paul, MN (US)

(72) Inventors: Manoj Nirmal, St. Paul, MN (US); Stephen P. Maki, North St. Paul, MN (US); Jason C. Radel, St. Louis Park, MN (US); Robert L. Brott, Woodbury, MN (US); Donald J. McClure, Lindstrom, MN (US); Clark I. Bright, Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/496,203

(22) Filed: Sep. 25, 2014

(65) Prior Publication Data
US 2015/0008023 A1  Jan. 8, 2015

Related U.S. Application Data

(63) Continuation of application No. 13/477,338, filed on May 22, 2012, now Pat. No. 8,854,589, which is a continuation of application No. 12/141,544, filed on Jun. 18, 2008, now abandoned.

(51) Int. Cl.
*G02F 1/1343* (2006.01)
*G02F 1/1333* (2006.01)
(Continued)

(52) U.S. Cl.
CPC .......... *H05K 1/0274* (2013.01); *G02F 1/13439* (2013.01); *G02F 1/13718* (2013.01); *H05K 1/053* (2013.01); *H05K 1/056* (2013.01); *H05K 1/115* (2013.01); *G02F 1/133502* (2013.01);
(Continued)

(58) Field of Classification Search
CPC ............... H05K 1/0274; H05K 1/053; H05K 2201/0108; H05K 1/115; G02F 1/13439; G02F 1/133502
USPC ................. 349/140, 142, 147, 148
See application file for complete search history.

(56) References Cited

U.S. PATENT DOCUMENTS 5,110,623 A * 5/1992 Yuasa et al. .................. 427/162
5,440,446 A    8/1995 Shaw et al.
(Continued)

FOREIGN PATENT DOCUMENTS

JP    01-028617    1/1989
JP    01059424 A * 3/1989 ............. G06F 3/033
(Continued)

*Primary Examiner* — Paul Lee
(74) *Attorney, Agent, or Firm* — Robert S. Moshrefzadeh

(57) ABSTRACT

A conducting film or device electrode includes a substrate and two transparent or semitransparent conductive layers separated by a transparent or semitransparent intervening layer. The intervening layer includes electrically conductive pathways between the first and second conductive layers to help reduce interfacial reflections occurring between particular layers in devices incorporating the conducting film or electrode.

4 Claims, 3 Drawing Sheets

(51) Int. Cl.
  H05K 1/02 (2006.01)
  G02F 1/137 (2006.01)
  H05K 1/05 (2006.01)
  H05K 1/11 (2006.01)
  G02F 1/1335 (2006.01)

(52) U.S. Cl.
  CPC .......... *G02F 2001/133521* (2013.01); *H05K 2201/0108* (2013.01); *H05K 2201/0338* (2013.01)

(56) References Cited

U.S. PATENT DOCUMENTS

| | | | |
|---|---|---|---|
| 5,667,853 | A | 9/1997 | Fukuyoshi et al. |
| 5,877,895 | A | 3/1999 | Shaw et al. |
| 6,010,751 | A | 1/2000 | Shaw et al. |
| 6,124,971 | A | 9/2000 | Ouderkirk et al. |
| 6,177,216 | B1 | 1/2001 | Broer et al. |
| 6,580,482 | B1 | 6/2003 | Hiji et al. |
| 6,597,419 | B1 | 7/2003 | Okada et al. |
| 6,812,977 | B1 | 11/2004 | Iwamatsu et al. |
| 6,839,108 | B1 * | 1/2005 | Hirakata et al. .......... 349/114 |
| 6,999,142 | B2 | 2/2006 | Stephenson et al. |
| 8,854,589 | B2 * | 10/2014 | Nirmal et al. ............ 349/147 |
| 2001/0040542 | A1 | 11/2001 | Harada et al. |
| 2002/0051103 | A1 | 5/2002 | Faris et al. |
| 2002/0118325 | A1 | 8/2002 | Hinata et al. |
| 2002/0176041 | A1 | 11/2002 | Hisamitsu et al. |
| 2003/0020844 | A1 | 1/2003 | Albert et al. |
| 2003/0124392 | A1 | 7/2003 | Bright |
| 2003/0160923 | A1 | 8/2003 | Ma |
| 2003/0231269 | A1 | 12/2003 | Ma |
| 2004/0032556 | A1 | 2/2004 | Yoon et al. |
| 2004/0046909 | A1 | 3/2004 | Sekiguchi |
| 2004/0125286 | A1 | 7/2004 | Moon et al. |
| 2004/0246411 | A1 | 12/2004 | Stephenson et al. |
| 2004/0263755 | A1 | 12/2004 | Kim et al. |
| 2005/0041183 | A1 | 2/2005 | Lee |
| 2005/0259208 | A1 | 11/2005 | Miki et al. |
| 2006/0012847 | A1 | 1/2006 | Ogasawara |
| 2006/0087863 | A1 | 4/2006 | Choi et al. |
| 2006/0119782 | A1 | 6/2006 | Sha et al. |
| 2006/0147652 | A1 | 7/2006 | Liu et al. |
| 2006/0181658 | A1 * | 8/2006 | Majumdar .......... G02F 1/13476 349/86 |
| 2006/0182898 | A1 | 8/2006 | Ben-Shalom et al. |
| 2006/0244702 | A1 | 11/2006 | Yamazaki et al. |
| 2006/0250549 | A1 * | 11/2006 | Kanou et al. .................. 349/113 |
| 2006/0262247 | A1 | 11/2006 | Stephenson, III et al. |
| 2007/0285611 | A1 | 12/2007 | Nose et al. |
| 2008/0023216 | A1 | 1/2008 | Hang et al. |
| 2008/0038529 | A1 | 2/2008 | Nakayama et al. |
| 2008/0137027 | A1 | 6/2008 | Tashiro et al. |

FOREIGN PATENT DOCUMENTS

| | | |
|---|---|---|
| JP | 01-261495 | 10/1989 |
| JP | 09-113881 | 5/1997 |
| JP | 9-291355 | 11/1997 |
| JP | H09305126 | 11/1997 |
| JP | 10-031210 | 2/1998 |
| JP | 11-274733 | 10/1999 |
| JP | 2001-297630 | 10/2001 |
| JP | 2003-057648 | 2/2003 |
| JP | 2004-145094 | 5/2004 |
| JP | 2006-350148 | 3/2006 |
| JP | 2006-301510 | 11/2006 |
| JP | 2009-146747 | 7/2009 |
| KR | 2005-0020339 | 3/2005 |
| WO | WO 99/26107 | 5/1999 |
| WO | WO 02/073306 | 9/2002 |
| WO | WO 03/060604 | 7/2003 |
| WO | 2005-019056 | 1/2005 |
| WO | WO 2006/054050 | 5/2006 |
| WO | WO 2007/004286 | 1/2007 |
| WO | WO 2009/050145 | 4/2009 |

* cited by examiner

TRANSPARENT CONDUCTING ARTICLE COMPRISING FIRST AND SECOND CONDUCTIVE LAYERS AND AN INTERVENING INORGANIC DIELECTRIC LAYER HAVING A PLURALITY OF APERTURES THEREIN

BACKGROUND

A cholesteric liquid crystal (ChLC) material consists of a nematic liquid crystal and a chiral additive blended together to spontaneously form a helical structure with a well defined pitch. This pitch determines the wavelength of light reflected by the material and hence the color of it. The color can also be adjusted by varying the ratio of the nematic liquid crystal and chiral components. A pixel in a ChLC display can be switched between its planar reflective (colored) state and its semi-transparent focal conic state by application of an appropriate drive scheme. In a ChLC device, reflections from the electrodes can occur, and those reflections are undesirable in that they degrade device performance.

SUMMARY

A conducting film or electrode, consistent with the present invention, includes a substrate and two transparent or semi-transparent conductive layers separated by a transparent or semitransparent intervening layer. The intervening layer, which helps reduce unwanted interfacial reflections occurring in a device incorporating this electrode, includes electrically conductive pathways between the two conductive layers. This improves the electrical properties of the conducting film or electrode relative to two electrically insulated conductive layers with the same combined conductive layer thickness.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Figure 1:
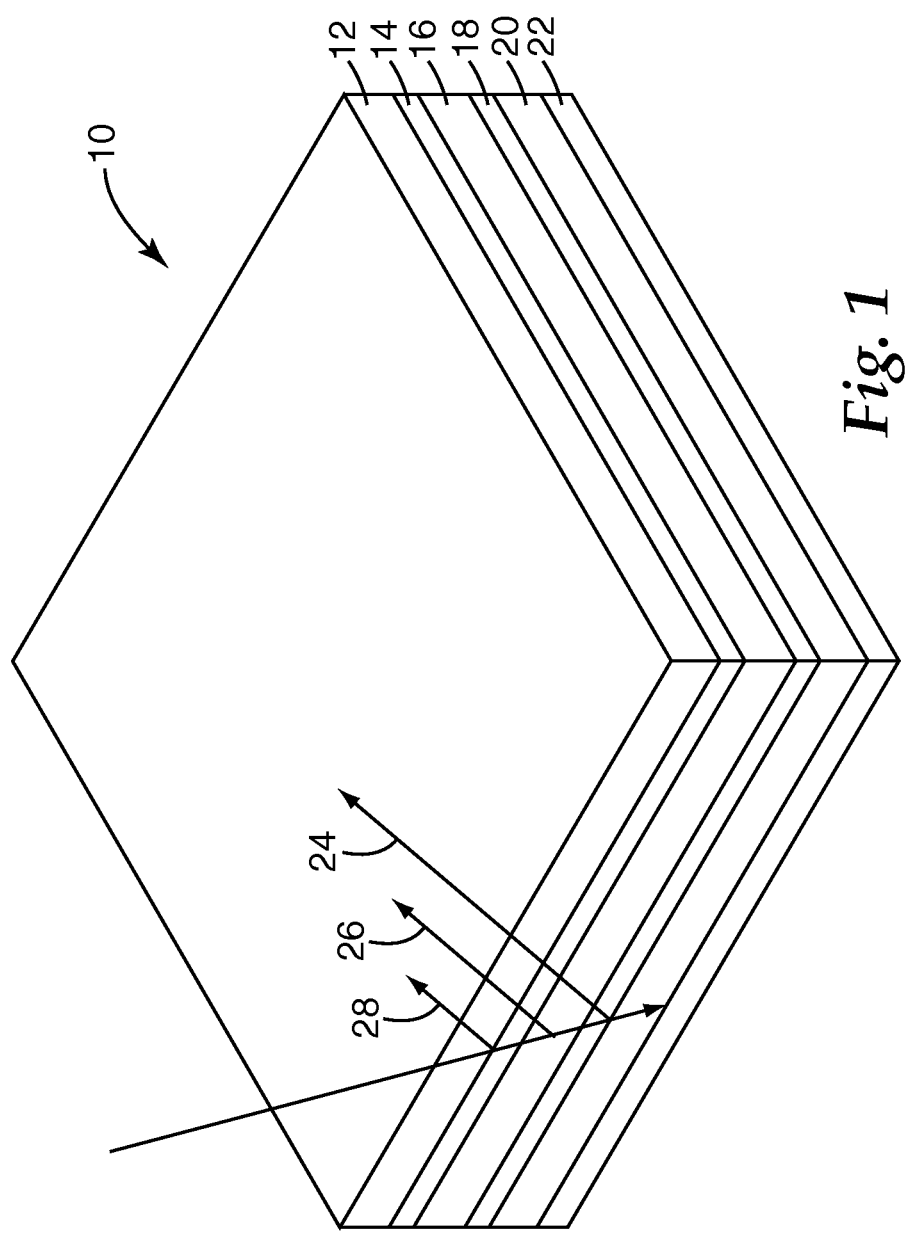
FIG. 1 is a perspective diagram of a single color ChLC display construction.

Embodiments of the present invention relate to display substrate electrodes with improved electrical and optical properties. The electrodes can be used in any display where, for example, reflections resulting between layers are detrimental to device performance. The electrodes can also be used with a variety of types of display materials such as ChLC material or electrochromic material. The term display material refers to any type of material activated by an electrode in a display device. Other display devices that can incorporate the electrodes include touch screens, liquid crystal display devices, and organic light emitting diode (OLED) devices. The electrodes can also be used in non-display devices such as, for example, passive windows, smart window, solar cells, and electro-optic devices.

Other embodiments of the present invention include a conducting film not used as a display device electrode. Such a conducting film can be used in film applications where the conductivity provides for infrared reflection. Examples of such film applications include the following: window; lighting; architectural; automotive; appliance; and scientific instrument. The conducting films can also be used in lighting and projectors where visible light is transmitted and infrared heat is reflected by the film.

The electrode or conducting film includes two or more conductive layers having a particular refractive index with intervening conductive or insulating layers having a different refractive index and having electrically conductive pathways. The conductive layers and intervening layers are each transparent or semitransparent. The thicknesses of the individual layers and the optical indexes of refraction of the individual layers within the electrode stack are tuned to minimize unwanted Fresnel reflections when these substrates are incorporated within a ChLC display. In a preferred embodiment, the conductive layers are symmetric, meaning they have the same thickness. In other embodiments, the conductive layers can have different thicknesses.

This electrode construction significantly improves the black level, color saturation, and hence the contrast of the display. In addition, the intervening layers permit electrical contact between the conductive layers of the electrode. As a result, the electrical conductivity of the multilayer electrode is higher than that of the individual conductive layers within the stack. Since the size of the display may be limited by the sheet resistance of the electrodes, the multilayer electrode enables the fabrication of larger display panels. Displays fabricated using the multilayer electrodes exhibit significantly improved electrical and optical performance compared with devices having single layer electrodes.

Unlike a conventional nematic liquid crystal (NLC) based display, a ChLC display does not require polarizers or color filters, resulting in a simpler device construction at a potentially lower cost. In a full color NLC display, the red-green-blue (RGB) subpixels are arranged side by side. As a result, only one third of the viewing area is occupied by each of the individual RGB primaries. On the other hand, each ChLC RGB subpixel reflects a single primary color while transmitting the other two.

FIG. 1 illustrates a single color ChLC display 10, including a stack having the following layers in the configuration as shown: a substrate 12; an electrode 14; a ChLC material 16; an electrode 18; a substrate 20; and a black absorber 22. A reflection 26 from ChLC material 16 results in a displayed color. Interfacial reflections 24 and 28 can occur between the layers, for example at the interfaces of the substrates and electrodes, and such interfacial reflections are undesirable. A full color ChLC display can be constructed by stacking a set of RGB panels with the individual RGB subpixels overlapped on top of each other and reflecting different regions of the spectrum. The back of the display panel is coated with broadband absorber 22 that absorbs the light not reflected by the preceding layers. Black absorbers include the following exemplary materials: KRYLON matte or glossy black acrylic enamel spray paint.

Figure 2:
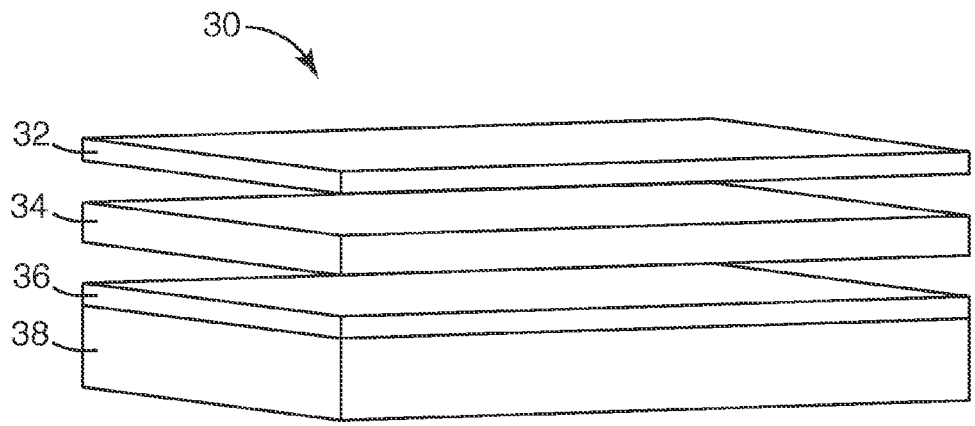
FIG. 2 is a diagram of a prior art electrode for a ChLC display.

FIG. 2 illustrates a prior art electrode 30 for a ChLC display. A substrate 38 provides support for the device. The prior art electrode includes two layers of transparent conductive oxide (TCO) layers 32 and 36 separated by a continuous layer of dielectric polymer 34. Substrates can be made using the following exemplary materials: glass; PET; PEN (polyethylene napthalate); PC (polycarbonate); PEEK (polyetheretherketone); PES (polyethersulphone); PAR (polyarylate); PI (polyimide); PMMA; PCO (polycyclic olefin); TAC (cellulose triacetate); and polyurethane. Transparent Conducting Oxides include the following exemplary materials: Indium Tin Oxide; Indium Zinc Oxide; Cadmium Oxide; $Zn_2SnO_4$; $ZnSnO_3$; $MgIn_2O_4$; $GaInO_3$; $(Ga,In)_2O_3$; $Zn_2In_2O_5$; $In_4Sn_3O_{12}$; $SnO_2$; and $In_2O_3$. Each subpixel in a ChLC display includes the ChLC material sandwiched between two conductive substrates. The subpixels may be bonded together using an optical adhesive. Alternatively, the conductor may be coated and patterned on both sides of each substrate, eliminating the optical adhesive layers. Red and yellow color filters may be included to improve color saturation and minimize color shifts with viewing angle. The observed color of each stacked pixel is determined by the sum of the reflections from each subpixel. The entire viewing area is utilized by the RGB primaries resulting in significantly improved brightness.

In its on (reflective) state, the light reflected by a pixel includes the ChLC planar reflection and unwanted Fresnel reflections at each interface due to refractive index mismatches, represented by reflections 24 and 28. Fresnel reflections are typically broadband and hence degrade the color saturation of the display. In its off state, the light reflected by a pixel includes scattering from the semi-transparent focalconic state and the interfacial Fresnel reflections. These reflections degrade the black level of the display and hence the contrast ratio.

The magnitude of the Fresnel reflection depends on the ratio of refractive indices at the interface. At normal incidence it is determined by the following equation:

$$R = \left(\frac{n-1}{n+1}\right)^2;$$

$$n = \frac{n_2}{n_1}$$

where n is the relative index of the two media with refractive indices n2, n1. Fresnel reflections are strongest at interfaces with the highest relative index. The refractive indices of the various layers of device 10 shown in FIG. 1 are the following: n=2.0 for the electrodes; n=1.65 for the substrate; and n=1.55 for the ChLC material. In device 10, the highest index step thus occurs at the interfaces between the high index indium tin oxide (ITO) transparent electrode and the polyethylene terephthalate (PET) substrate or the ChLC. Device 10 includes two ITO/PET and two ITO/ChLC interfaces. Depending on the illumination and viewing geometry, broadband Fresnel reflections from these interfaces can exceed the reflectivity of the ChLC, significantly degrading display performance.

In comparison, the electrode design of embodiments of the present invention yields both good optical and electrical performance. The intervening layer in the electrode design is a transparent or semitransparent layer having electrically conductive pathways that enable electrical contact between the two conductive layers. The pathways may form naturally by controlling the thickness and deposition conditions of the intervening layer. The chemical and physical properties of the first conductive layer nearest the substrate may also be adjusted to enable formation of these pathways by changing the wetting properties of the intervening layer such that the intervening layer is discontinuous to allow electrical contact between the adjacent layers. Alternatively, the pathways could be created using techniques such as laser ablation, ion bombardment or wet/dry etching.

The intervening layer may be deposited using vapor deposition techniques such as sputtering, e-beam, and thermal evaporation. It may also be formed using solution coating. An ultrabarrier film process, in which a monomer is evaporated onto the substrate and cured in-situ, may also be used. Ultrabarrier films include multilayer films made, for example, by vacuum deposition of two inorganic dielectric materials sequentially in a multitude of layers on a glass or other suitable substrate, or alternating layers of inorganic materials and organic polymers, as described in U.S. Pat. Nos. 5,440,446; 5,877,895; and 6,010,751, all of which are incorporated herein by reference as if fully set forth.

Figure 3:
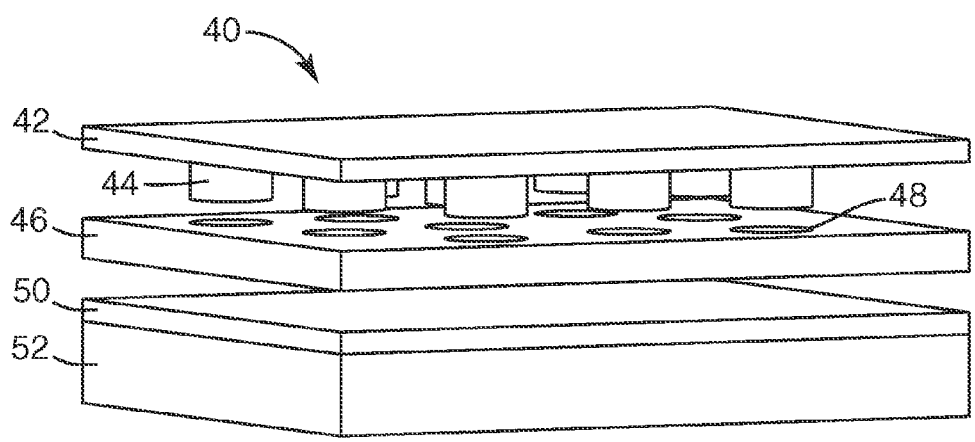
FIG. 3 is a diagram of a ChLC display electrode having an intervening layer with conductive paths.

One embodiment is shown as a device electrode 40 of FIG. 3. This electrode includes two high index conductive layers 42 and 50 of TCO or semitransparent conductive oxide separated by a lower index transparent or semitransparent layer 46 having electrically conductive pathways comprising conductive links 44 extending through apertures 48 in transparent layer 46 to connect the electrodes 42 and 50. A substrate 52 provides support for the device. The layers are drawn apart to illustrate the concept.

Figure 4:
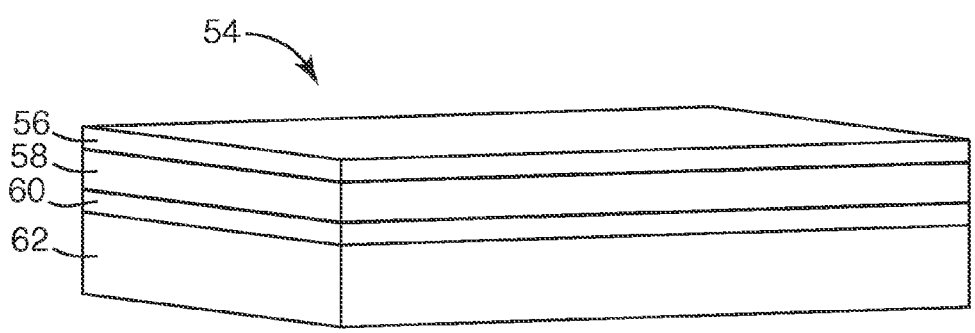
FIG. 4 is a diagram of a ChLC display electrode having an intervening conductive layer.

In another embodiment, the intervening layer is a transparent or semitransparent conductor with a lower refractive index than the conductive layers on either side, as shown in device electrode 54 of FIG. 4. In electrode 54, the intervening conductive layer 58 may provide continuous electrically conductive pathways between the two adjacent conductive layers 56 and 60 of TCO or semitransparent conductive oxide. A substrate 62 provides support for the display. The intervening layer 58 may comprise a solution coated or electro-deposited conductive polymer. It can also be a vapor deposited transparent conductor. Conducting polymers include the following exemplary materials: polyaniline; polypyrrole; polythiophene; and PEDOT/PSS (poly(3,4-ethylenedioxythiophene)/polystyrenesulfonic acid). The combined thickness of the conductive layers is constrained by the sheet resistance requirements while the thicknesses of the individual layers are optimized for the desired optical properties.

Figure 5:
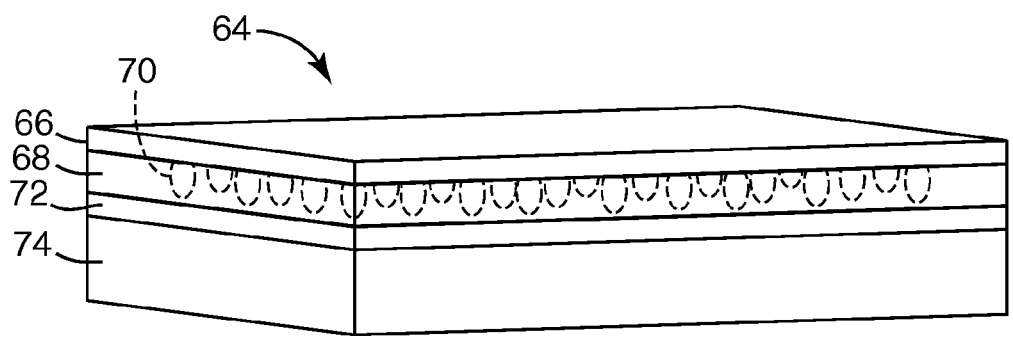
FIG. 5 is a diagram of a ChLC display electrode having an intervening layer with conductive particles dispersed in a binder.

In yet another embodiment, the intervening layer comprises conductive particles dispersed in a binder, as shown in device electrode 64 of FIG. 5. The conductive particles 70 in binder 68 provide conductive pathways between the conductive layers 66 and 72 of TCO or semitransparent conductive oxide. A substrate 74 provides support for the device. The binder can be conductive or insulating. The conductive particles can be organic, inorganic, or metallic. The refractive index of the intervening layer can be adjusted by varying the volume fractions of the binder and conductive particles.

The matrix and embedded conducting nanoparticles can include the following. The matrix can include any transparent or semitransparent (conductive or insulating) polymer (e.g., acrylates, methacrylates, or the conducting polymers listed above), or a transparent or semitransparent inorganic material either conductive (such as the TCOs listed above) or insulating ($SiO_2$, silicon nitride ($Si_xN_y$), Zinc Oxide ($Z_nO$), aluminum oxide ($Al_2O_3$), or magnesium fluoride ($MgF_2$)). The conducting nanoparticles can include conducting polymers such as those listed above, or metals (e.g., silver, gold, nickel, chrome). If the matrix is conductive then the nanoparticles can be insulating, in particular they can be nanoparticles of the insulating materials listed above (e.g., $SiO_2$, silicon nitride, zinc oxide, or other insulating materials.)

Figure 6:
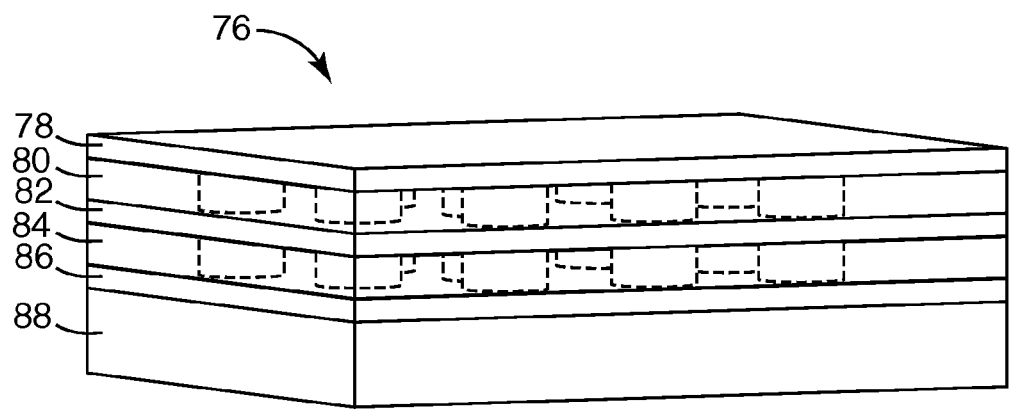
FIG. 6 is a diagram of a ChLC display electrode having multiple intervening layers and an insulating layer to be in contact with a display medium.
Figure 7:
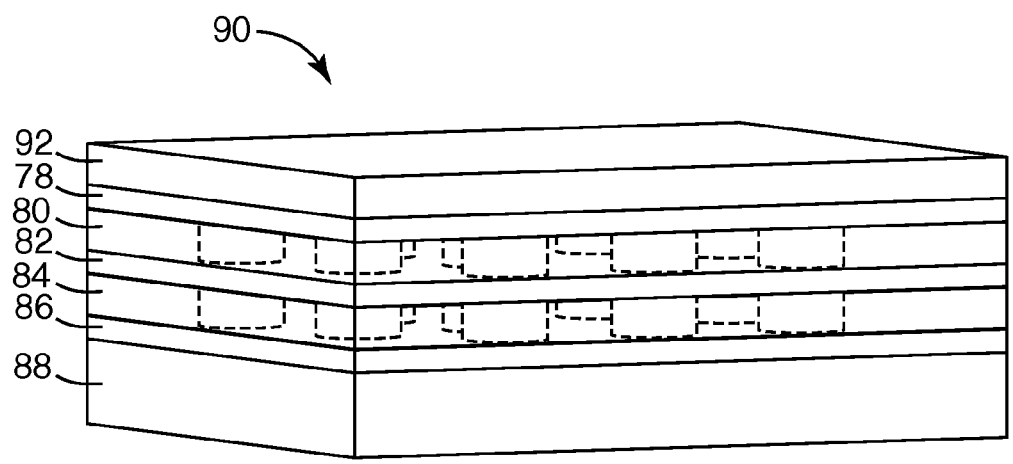
FIG. 7 is a diagram of a ChLC display electrode having multiple intervening layers and a conductive layer to be in contact with a display medium.

While the embodiments described above include two transparent or semitransparent conductive layers separated by an intervening layer, additional transparent or semitransparent conductive and intervening layers may be added depending on the desired optical and electrical properties, as shown in FIGS. 6 and 7. Device electrodes 76 and 90 shown in FIGS. 6 and 7 include the following layers functioning as a single electrode: multiple transparent or semitransparent conductive layers 78, 82, and 86; intervening transparent or semitransparent layers 80 and 84 between the conductive layers; and a substrate 88. Additional layers of conductive layers and intervening layers can be added as well such that the electrode has any number of layers optimized or tuned for a particular device. Also, the layer in contact with the display medium, when the electrode is used with a display device, may be insulating or conductive depending on the switching mechanism (e.g., current or field driven), such as conductive layer 78 shown in FIG. 6 or an insulating layer 92 shown in FIG. 7.

For a three color ChLC display, the electrodes for each color can be designed or tuned for a particular wavelength range in order to minimize interfacial reflections. Table 1 includes thicknesses in nanometers (nm) of an optimized electrode construction for individual colors (RGB ChLC material layers) in a ChLC display device.

TABLE 1

| Electrode | Conductive Layer (ITO) | Intervening Layer | Conductive Layer (ITO) |
|---|---|---|---|
| blue layer | 20 | 42.8 | 20 |
| green layer | 20 | 46.88 | 20 |
| red layer | 20 | 56.11 | 20 |

EXAMPLE

Substrates with the three-layer electrode design shown in FIG. 4 were fabricated. The intervening layer consisted of an acrylate polymer deposited using the ultrabarrier process identified above, and the two conductive layers consisted of sputter deposited ITO. Three layer electrodes with different intervening layer and ITO layer thicknesses were fabricated on a roll of 0.005 inch thick PET as identified in Table 2.

TABLE 2

| Design | ITO 1 fpm | Polymer fpm | ITO 2 fpm |
|---|---|---|---|
| 1 | 3.8 | 68 | 3.8 |
| 2 | 4.3 | 68 | 4.3 |
| 3 | 4.8 | 68 | 4.8 |
| 4 | 4.8 | 66 | 4.8 |
| 5 | 3.8 | 66 | 3.8 |
| 6 | 3.8 | 64 | 3.8 |
| 7 | 4.3 | 64 | 4.3 |
| 8 | 4.8 | 64 | 4.8 |

The individual layer thicknesses were determined by the speed of the film in feet per minute (fpm) across the ITO and ultrabarrier film deposition sources. Faster speeds yield thinner layers. The sheet resistance of these samples was measured using a non-contact probe (Delcom) that measures the combined conductivity of both ITO layers and a surface contact 4-probe instrument that measures the conductivity of the top, exposed surface. Both measurement techniques yielded sheet resistance values that are identical within the measurement error indicating that the intervening layer permits electrical contact between the two adjacent ITO layers.

Full color RGB, ChLC devices fabricated using substrates having index matched three-layer electrodes, and single layer non-index matched electrodes were compared. The broadband, interfacial reflection was much more pronounced with the non-index matched electrode. These reflections degrade the color saturation relative to devices with index matched electrodes.

The color gamut of the device with the index matched electrodes was three times larger than that of the device with the non-index matched electrodes. The stronger interfacial reflections also degraded the black level of devices with non-index matched electrodes relative to those with index matched electrodes. As a result the contrast ratio, defined as the ratio of the brightness (CIE Y) of the white to black states, was much higher for devices with index matched electrodes.

Devices were also fabricated from three-layer electrode substrates in which the intervening layer consisted of $SiO_2$, an inorganic material instead of the ultrabarrier film layer. The three-layer electrode consisted of ITO(20 nm)/$SiO_2$(42 nm)/ITO(20 nm), which were sputtered onto 5 mil PET (Dupont Teijin, ST-504). These substrates also exhibited improved electrical and optical properties when incorporated into ChLC, RGB devices. Both the color saturation (Gamut) and contrast were significantly higher for the device with the index matched, three-layer electrode. The color gamut was over four times larger and the contrast over five times higher with the three-layer index matched electrode.

The three layer electrode design also enables low sheet resistance in conjunction with good optical performance. Each intervening low index layer permits electrical contact between the adjacent transparent conductive layers. As a result the conductivity of the multilayer electrode is determined by the combined thickness of all the conductive layers. A display was fabricated from substrates with the three layer electrode. The lower sheet resistance of this substrate (approximately 100 ohms/sq) compared to those using a single layer electrode enabled excellent display uniformity with no fading in the pattern across the display. Both the color saturation and display uniformity were observed to be very good.

The invention claimed is:

1. A transparent conducting article comprising:
   a first electrically conductive transparent layer;
   an intervening inorganic dielectric layer substantially coextensive with and disposed directly on the first conductive layer;
   a second electrically conductive transparent layer substantially coextensive with and disposed directly on the intervening layer, the intervening layer defining a plurality of apertures therein, the first and second conductive layers directly contacting one another through the plurality of apertures.

2. The conducting article of claim 1, wherein the first electrically conductive transparent layer comprises indium tin oxide.

3. The conducting article of claim 1, wherein the second electrically conductive transparent layer comprises indium tin oxide.

4. The conducting article of claim 1, wherein the intervening layer comprises SiO2.

* * * * *